United States Patent
Liu et al.

(10) Patent No.: US 9,286,158 B2
(45) Date of Patent: Mar. 15, 2016

(54) PROGRAMMING METHOD, READING METHOD AND OPERATING SYSTEM FOR MEMORY

(71) Applicant: Macronix International Co., Ltd., Hsinchu (TW)

(72) Inventors: Chien-Hsin Liu, Tainan (TW); Su-Chueh Lo, Hsinchu (TW); Kuen-Long Chang, Taipei (TW); Ken-Hui Chen, Hsinchu (TW); Chun-Hsiung Hung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 164 days.

(21) Appl. No.: 14/173,873

(22) Filed: Feb. 6, 2014

(65) Prior Publication Data

US 2015/0220390 A1 Aug. 6, 2015

(51) Int. Cl.
| | | |
|---|---|---|
| *G06F 11/00* | (2006.01) |
| *H03M 13/00* | (2006.01) |
| *G06F 11/10* | (2006.01) |
| *H03M 13/19* | (2006.01) |
| *H03M 13/15* | (2006.01) |

(52) U.S. Cl.
CPC ........ *G06F 11/1072* (2013.01); *G06F 11/1012* (2013.01); *H03M 13/1575* (2013.01); *H03M 13/19* (2013.01)

(58) Field of Classification Search
CPC ............ G11C 11/005; G11C 11/5621; G11C 11/5628; G11C 11/5635; G11C 11/5642; G11C 16/26; G11C 16/3454; G11C 16/3459; G11C 16/3481; G11C 16/12; G11C 7/1006; G11C 2211/5642; G11C 2211/5621; G11C 2211/5641
See application file for complete search history.

(56) References Cited

U.S. PATENT DOCUMENTS

| | | | | |
|---|---|---|---|---|
| 5,621,682 A * | 4/1997 | Tanzawa | ............. | G06F 11/1072 365/185.03 |
| 5,982,667 A * | 11/1999 | Jyouno | ................ | G11C 11/005 365/185.03 |
| 7,394,697 B2 * | 7/2008 | Jyouno | ................ | G11C 11/005 365/185.03 |
| 8,255,770 B2 * | 8/2012 | Park | ................... | G11C 11/5621 714/763 |

* cited by examiner

*Primary Examiner* — Guerrier Merant
(74) *Attorney, Agent, or Firm* — McClure, Qualey & Rodack, LLP

(57) ABSTRACT

A programming method, a reading method and an operating system for a memory are provided. The programming method includes the following steps. A data is provided. A parity generation is performed to obtain an error-correcting code (ECC). The memory is programmed to record the data and the error-correcting code. The data is transformed before performing the parity generation, such that a hamming distance between two codes corresponding to two adjacent threshold voltage states in the data to be performed the parity generation is 1.

17 Claims, 4 Drawing Sheets

PROGRAMMING METHOD, READING METHOD AND OPERATING SYSTEM FOR MEMORY

BACKGROUND

1. Technical Field

The disclosure relates in general to a programming method, a reading method and an operating system, and more particularly to a programming method, a reading method and an operating system for a memory.

2. Description of the Related Art

With the development of the semiconductor technology, research on a memory having an array of multilevel cells has drawn more and more attentions. One multilevel cell of the memory can be programmed to be a plurality of states having different threshold voltages for recording data. The data recorded in each multilevel cell can be read by detecting the threshold voltage thereof.

However, due to a retention issue, some bits of the data recorded in the multilevel cell may not be correctly read. An error-correct code can be used for correcting those wrong bits. The number of the correctable bits and the size of the error-correcting code are positive correlation. To meet market requirements regarding the size of the memory, how to reduce the size of the error-correct code is a challenge for the researcher.

SUMMARY

The disclosure is directed to a programming method, a reading method and an operating system for a memory. A data is transformed, such that the size of an error-correct code can be reduced.

According to a first aspect of the present disclosure, a programming method for a memory is provided. The programming method includes the following steps. A data is provided. A parity generation is performed to obtain an error-correcting code (ECC). The memory is programmed to record the data and the error-correcting code. The data is transformed before performing the parity generation, such that a hamming distance between two codes corresponding to two adjacent threshold voltage states in the data to be performed the parity generation is 1.

According to a second aspect of the present disclosure, a reading method for a memory is provided. The reading method includes the following steps. A data and an error-correcting code recorded in the memory are read. A syndrome generation is performed on the data. A correction is performed on the data according to an output of the syndrome generation. The data is transformed before performing the syndrome generation, such that a hamming distance between two codes corresponding to two adjacent threshold voltage states in the data to be performed the syndrome generation is 1.

According to a third aspect of the present disclosure, an operating system for programming a memory is provided. The operating system includes an inputting unit, a parity generation unit and a transforming unit. The inputting unit is for providing a data. The parity generation unit is for performing a parity generation to obtain an error-correcting code (ECC). The transforming unit is for transforming the data before performing the parity generation, such that a hamming distance between two codes corresponding to two adjacent threshold voltage states in the data to be performed the parity generation is 1.

The above and other aspects of the disclosure will become better understood with regard to the following detailed description of the non-limiting embodiment(s). The following description is made with reference to the accompanying drawings.

DETAILED DESCRIPTION

Preferred embodiments are disclosed below for elaborating the invention. A data is transformed, such that the size of an error-correct code can be reduced. The following embodiments are for the purpose of elaboration only, not for limiting the scope of protection of the invention. Besides, secondary elements are omitted in the following embodiments to highlight the technical features of the invention.

Figure 1:
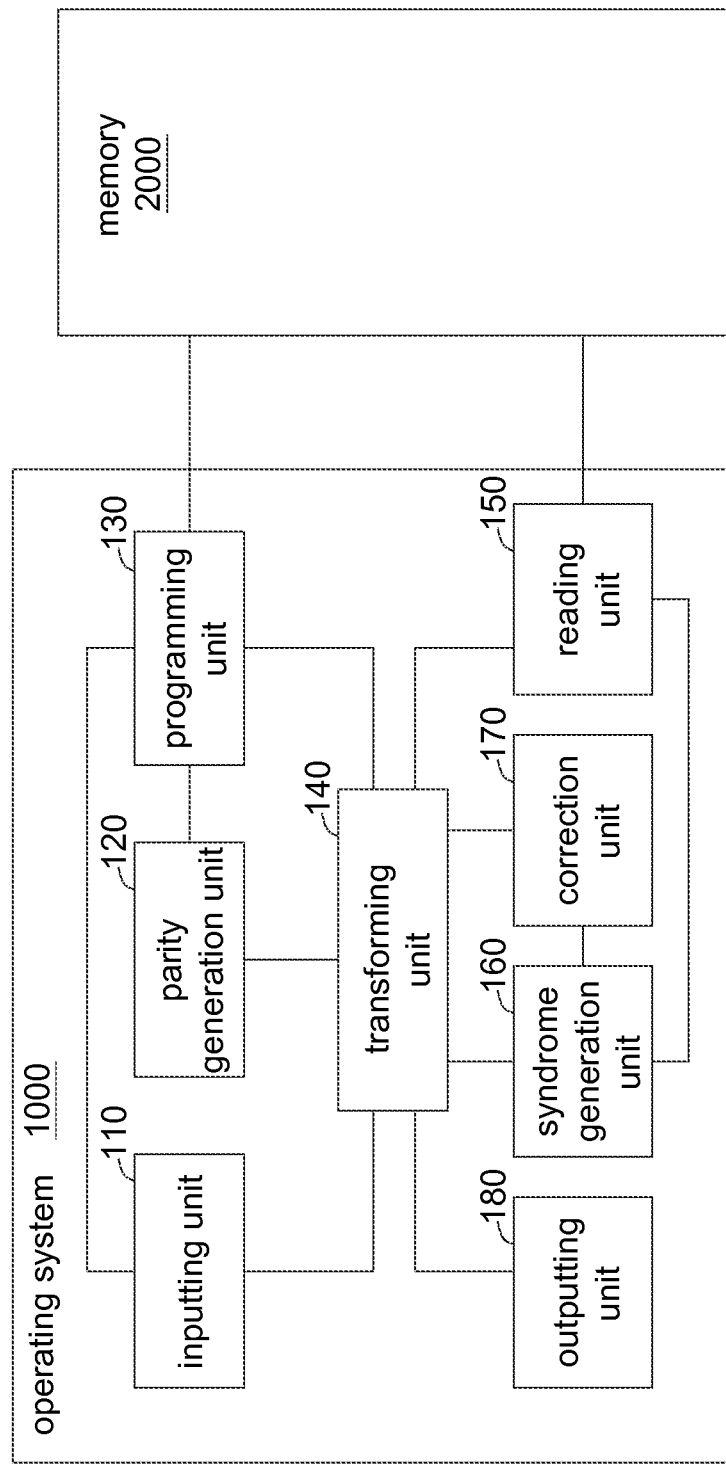
FIG. 1 shows a block diagram of an operating system for programming or reading a memory.

Please referring to FIG. 1, FIG. 1 shows a block diagram of an operating system 1000 for programming or reading a memory 2000. The operating system 1000 is electrically connected to the memory 2000. The operating system 1000 may be a computer, a circuit board, a chip or a circuit having a function for programming or reading the memory 2000. The operating system 1000 includes an inputting unit 110, a parity generation unit 120, a programming unit 130, a transforming unit 140, a reading unit 150, a syndrome generation unit 160, a correction unit 170 and an outputting unit 180.

The inputting unit 110 is for providing varied data. For example, the inputting unit 110 may be a keyboard, a touch screen, a transmission line, a circuit path on a circuit board or a circuit having a function for providing varied data.

The parity generation unit 120 is for performing a parity generation. For example, the parity generation unit 120 may be a chip, a firmware circuit on a circuit board, a storage device storing a plurality of program codes or a circuit having a function for performing the parity generation.

The programming unit 130 is for programming the memory 2000. For example, the programming unit 130 may be a chip, a circuit board or a circuit having a function for programming the memory 2000.

The transforming unit 140 is for transforming the codes of the data. For example, the transforming unit 140 may be a chip, a circuit board or a circuit having a function for transforming the codes of the data.

The reading unit 150 is for reading the memory 2000. For example, the reading unit 150 may be a chip, a circuit board or a circuit having a function for reading the memory 2000.

The syndrome generation unit 160 is for performing a parity generation. For example, the syndrome generation unit 160 may be a chip, a firmware circuit on a circuit board, a storage device storing a plurality of program codes or a circuit having a function for performing the syndrome generation.

The correction unit 170 is for performing a parity generation. For example, the correction unit 170 may be a chip, a firmware circuit on a circuit board, a storage device storing a plurality of program codes or a circuit having a function for performing the correction.

The outputting unit 180 is for outputting varied data. For example, the outputting unit 180 may be a display, a printer, a storage device, a transmission line or a circuit having a function for outputting varied data.

Figure 2A:
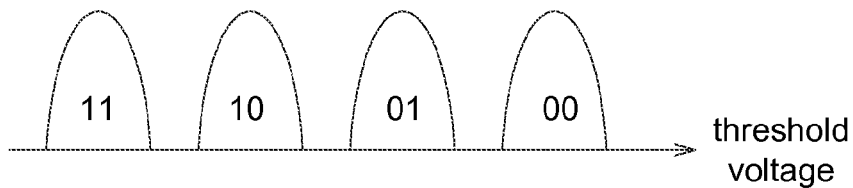
FIG. 2A shows a set of two-bits codes representing a plurality of threshold voltage states of a multilevel cell.

The memory 2000 may be a NOR memory including an array of multilevel cells (MLC). Please referring to FIG. 2A, FIG. 2A shows a set of two-bits codes representing a plurality of threshold voltage states of a multilevel cell. In FIG. 2A, the threshold voltage states are respectively represented by two-bits codes "11", "10", "01" and "00" in turn.

In the multilevel cell, a charge loss or a charge gain may be caused by a retention issue. For example, if the charge loss is happed, the code "10" may be read as the code "11", the code "01" may be read as the code "10", and etc. If the charge gain is happened, the code "11" may be read as the code "10", the code "10" may be read as the code "01", and etc. For keeping the accuracy of the data, an error-correcting code (ECC) can be recorded with the data to correct the wrong codes. The number of the correctable bits and size of the error-correcting code are positive correlation.

Please referring to Table 1, Table 1 shows the charge loss and the charge gain of the multilevel cell whose threshold voltage states are respectively represented by codes "11", "10", "01" and "00" in turn. When the charge loss is happened, the code "01" may be read as the code "10" which has two wrong bits and should be corrected by an error-correcting code whose number of the correctable bits is 2. When the charge gain is happened, the code "10" may be read as the code "01" which has two wrong bits and should be corrected by an error-correcting code whose number of the correctable bits is 2.

TABLE 1

|  | Original | Read | Number of wrong bits |
| --- | --- | --- | --- |
| Charge loss | 00 | 01 | 1 |
| Charge loss | 01 | 10 | 2 |
| Charge gain | 01 | 00 | 1 |
| Charge loss | 10 | 11 | 1 |
| Charge gain | 10 | 01 | 2 |
| Charge gain | 11 | 10 | 1 |

Figure 2B:
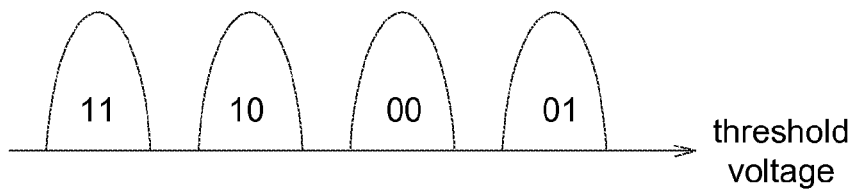
FIG. 2B shows another set of two-bits codes representing the threshold voltage states of the multilevel cell in FIG. 2A.

Please referring to FIG. 2B, FIG. 2B shows another set of two-bits codes representing the threshold voltage states of the multilevel cell in FIG. 2A. In FIG. 2B, the threshold voltage states are respectively represented by two-bits codes "11", "10", "00" and "01" in turn.

Please referring to Table 2, Table 2 shows the charge loss and the charge gain of the multilevel cell whose threshold voltage states are respectively represented by codes "11", "10", "00" and "01" in turn. The codes "11", "10", "00" and "01" is coded according to a gray code system. When the charge gain or the charge gain is happened, only 1 bit will be wrong and can be corrected by an error-correcting code whose number of the correctable bits is 1.

TABLE 2

|  | Original | Read | Number of wrong bits |
| --- | --- | --- | --- |
| Charge loss | 01 | 00 | 1 |
| Charge loss | 00 | 10 | 1 |
| Charge gain | 00 | 01 | 1 |
| Charge loss | 10 | 11 | 1 |
| Charge gain | 10 | 00 | 1 |
| Charge gain | 11 | 10 | 1 |

In FIG. 2B, the threshold voltage states of the multilevel cell are respectively represented by codes "11", "10", "00" and "01" in turn. The hamming distance between two codes corresponding to two adjacent threshold voltage states is 1; thus any charge lose or charge gain will cause only 1 bit to be wrong.

The set of codes in FIG. 2A can be transformed to the set of codes in FIG. 2B by transforming the code "01" to be the code "00" and transforming the code "00" to be the code "01". After transforming, the size of the error-correcting code can be reduced.

Figure 3:
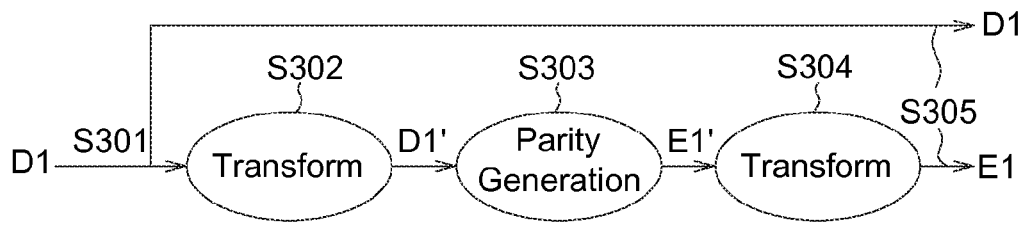
FIG. 3 shows a flowchart of a programming method for the memory.

Please referring to FIG. 3, a flowchart of a programming method for the memory 2000 is shown. In step S301, the inputting unit 110 provides a data D1. For example, four threshold voltage states of the data D1 are respectively represented by four codes "11", "10", "01" and "00" in turn.

In step S302, the transforming unit 140 transforms the data D1 to be a data D1'. For example, the transforming unit 140 transforms the code "01" to be the code "00" and transforms the code "00" to be the code "01", such that the threshold voltage states of the data D1' are respectively represented by codes "11", "10", "00" and "01" in turn and a hamming distance between two codes corresponding to two adjacent threshold voltage states in the data D1' is 1.

In step S303, the parity generation unit 120 performs a parity generation to obtain an error-correcting code E1'.

In step S304, the transforming unit 140 transforms the error-correcting code E1' to be an error-correcting code E1. For example, the transforming unit 140 transforms the code "01" to be the code "00" and transforms the code "00" to be the code "01", such that the threshold voltage states of the error-correcting code E1 are respectively represented by codes "11", "10", "00" and "01" in turn and the hamming distance between two codes corresponding to two adjacent threshold voltage states in the error-correcting code E1 is 1.

In step S305, the programming unit 130 programs the memory 2000 to record the data D1 and the error-correcting code E1.

Figure 4:
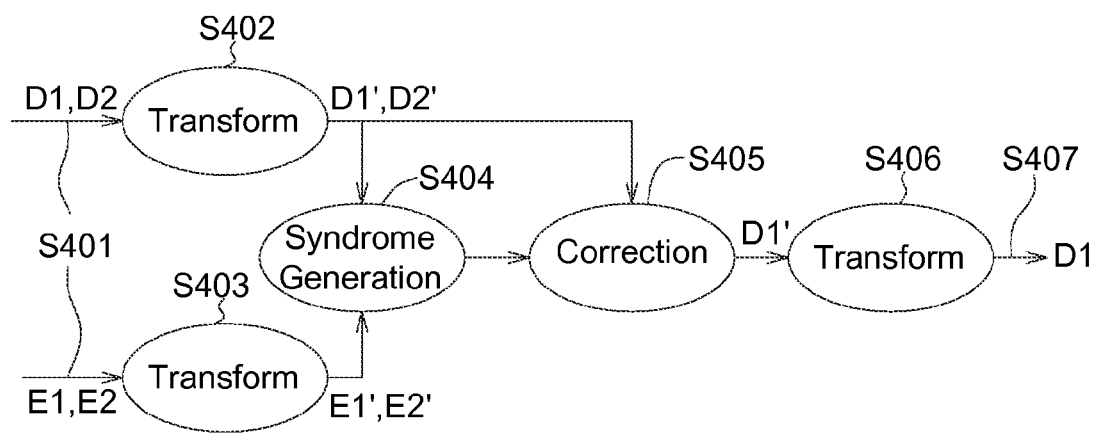
FIG. 4 shows a flowchart of a reading method for the memory.

Please referring to FIG. 4, a flowchart of a reading method for the memory 2000 is shown. In step S401, the reading unit 150 reads the data D1 and the error-correcting code E1 recorded in the memory 2000. Due to the retention issue, the data D1 may become a wrong data D2, or the error-correcting code E1 may become a wrong error-correct code E2.

In step S402, the transforming unit 140 transforms the data D1 to be the data D1', or transforms the data D2 to be a data D2'. For example, the transforming unit 140 transforms the code "01" to be the code "00" and transforms the code "00" to be the code "01", such that the threshold voltage states of the data D1', D2' are respectively represented by codes "11", "10", "00" and "01" in turn and the hamming distance between two codes corresponding to two adjacent threshold voltage states in the data D1', D2' is 1.

In step S403, the transforming unit 140 transforms the error-correct code E1 to be the error-correct code E1', or transforms the error-correct code E2 to be an error-correct code E2'. For example, the transforming unit 140 transforms the code "01" to be the code "00" and transforms the code "00" to be the code "01", such that the threshold voltage states of the error-correct code E1', E2' are respectively represented by codes "11", "10", "00" and "01" in turn and the hamming distance between two codes corresponding to two adjacent threshold voltage states in the error-correct code E1', E2' is 1.

In step S404, the syndrome generation unit 160 performs the syndrome generation on the data D1', D2' to analyze which bit of the data D1', D2' is wrong.

In step S405, the correction unit 170 performs the correction on the data D1', D2' according to an output of the syndrome generation to obtain the correct data D1'.

In step S406, the transforming unit 140 transforms the data D1' to be the data D1. For example, the transforming unit 140 transforms the code "01" to be the code "00" and transforms the code "00" to be the code "01", such that the threshold voltage states of the data D1 are respectively represented by codes "11", "10", "00" and "01" in turn and the hamming distance between two codes corresponding to two adjacent threshold voltage states in the data D1 is 1.

In step S407, the outputting unit 180 outputs the data D1.

Base on above, the parity generation, the syndrome generation and the correction in FIGS. 3 and 4 are performed under a code system whose any hamming distance between two codes corresponding to two adjacent threshold voltage states is 1. Therefore, the size of the error-correct code can be reduced.

Figure 5:
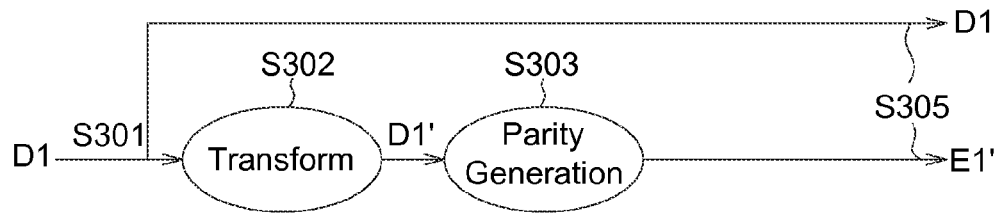
FIG. 5 shows a flowchart of another programming method for the memory.

Please referring to FIG. 5, FIG. 5 shows a flowchart of another programming method of the memory 2000. In another embodiment, the error-correcting code E1' resulted from the parity generation does not need to be transformed and can be recorded in the memory 2000 directly.

Figure 6:
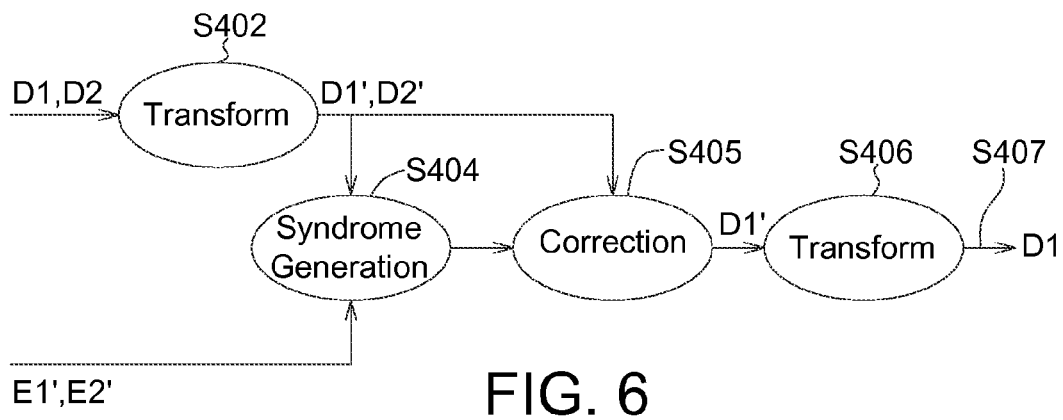
FIG. 6 shows a flowchart of another reading method for the memory.

Please referring to FIG. 6, FIG. 6 shows a flowchart of another reading method of the memory 2000. In another embodiment, the error-correcting code E1' or the error-corrected code E2' read from the memory 2000 does not need to be transformed and can be performed the syndrome generation directly.

Base on above, the parity generation, the syndrome generation and the correction in FIGS. 5 and 6 are performed under a code system whose any hamming distance between two codes corresponding to two adjacent threshold voltage states is 1. Therefore, the size of the error-correct code can be reduced.

Figure 7A:
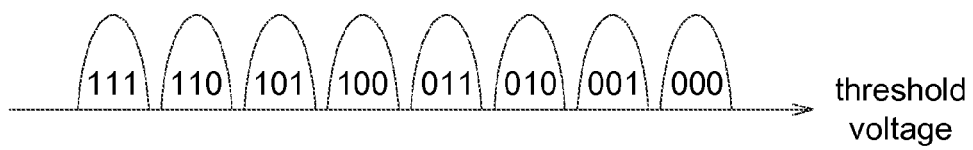
FIG. 7A shows a set of three-bits codes representing a plurality of threshold voltage states of a multilevel cell.

Please referring to FIG. 7A, FIG. 7A shows a set of three-bits codes representing a plurality of threshold voltage states of a multilevel cell. In FIG. 7A, the eight threshold voltage states are respectively represented by three-bits codes "111", "110", "101", "100", "011", "010", "001" and "000" in turn. When the charge loss is happened, the code "011" may be read as the code "100" which has three wrong bits and should be corrected by an error-correcting code whose number of the correctable bits is 3.

Figure 7B:
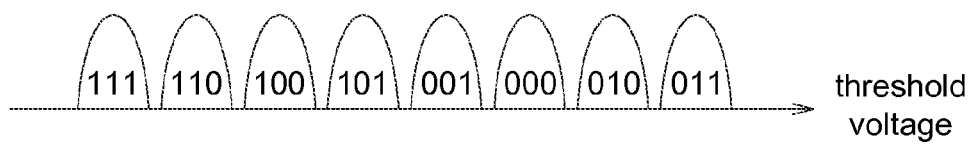
FIG. 7B shows another set of three-bits codes representing the threshold voltage states of the multilevel cell in FIG. 7A.

Please referring to FIG. 7B, FIG. 7B shows another set of three-bits codes representing the threshold voltage states of the multilevel cell in FIG. 7A. In FIG. 7B, the eight threshold voltage states are respectively represented by three-bits codes "111", "110", "100", "101", "001", "000", "010" and "011" in turn. The codes "111", "110", "100", "101", "001", "000", "010" and "011" are coded according to a gray code system. The hamming distance between two codes corresponding to two adjacent threshold voltage states is 1; thus any charge lose or any charge gain will cause only 1 bit to be wrong and the wrong bit can be corrected by an error-correcting code whose number of the correctable bits is 1.

The set of codes in FIG. 7A can be transformed to the set of codes in FIG. 7B by transforming the code "101" to be the code "100", and transforming the code "100" to be the code "101", transforming the code "011" to be the code "001", transforming the code "010" to be the code "000", transforming the code "001" to be the code "010", and transforming the code "000" to be the code "011". After transforming, the size of the error-correcting code can be reduced.

Figure 8A:
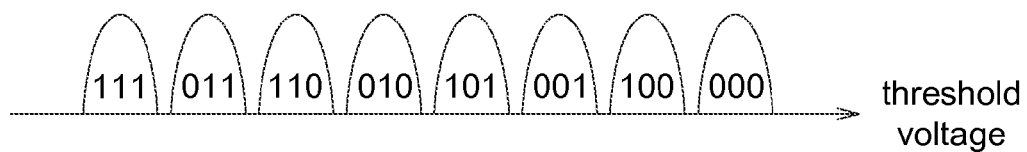
FIG. 8A shows a set of three-bits codes representing a plurality of threshold voltage states of a multilevel cell.

Please referring to FIG. 8A, FIG. 8A shows a set of three-bits codes representing a plurality threshold voltage states of a multilevel cell. In FIG. 8A, the threshold voltage states are respectively represented by three-bits codes "111", "011", "110", "010", "101", "001", "100" and "000" in turn. When the charge loss is happened, the code "101" may be read as the code "010" which has three wrong bits and should be corrected by an error-correcting code whose number of the correctable bits is 3.

Figure 8B:
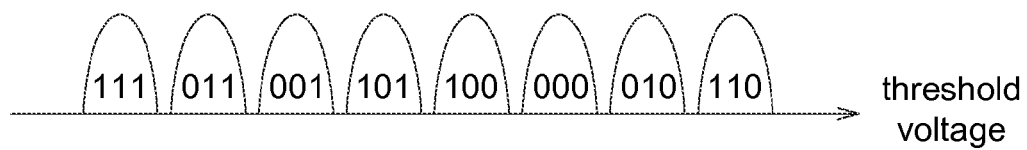
FIG. 8B shows another set of three-bits codes representing the threshold voltage states of the multilevel cell in FIG. 8A.

Please referring to FIG. 8B, FIG. 8B shows another set of three-bits codes representing the threshold voltage states of the multilevel cell in FIG. 8A. In FIG. 8B, the threshold voltage states are respectively represented by three-bits codes "111", "011", "001", "101", "100", "000", "010" and "110" in turn. The codes "111", "011", "001", "101", "100", "000", "010" and "110" are coded according to a gray code system. The hamming distance between two codes corresponding to two adjacent threshold voltage states is 1; thus any charge lose or any charge gain will cause only 1 bit to be wrong and the wrong bit can be corrected by an error-correcting code whose number of the correctable bits is 1.

The set of codes in FIG. 8A can be transformed to the set of codes in FIG. 8B by transforming the code "110" to be the code "001", and transforming the code "010" to be the code "101", transforming the code "101" to be the code "100", transforming the code "001" to be the code "000", transforming the code "100" to be the code "010", and transforming the code "000" to be the code "110". After transforming, the size of the error-correcting code can be reduced.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A programming method for a memory, comprising:
providing a data;
performing a parity generation to obtain an error-correcting code (ECC); and
programming the memory to record the data and the error-correcting code;
wherein the data is transformed before performing the parity generation, such that a hamming distance between two codes corresponding to two adjacent threshold voltage states in the data to be performed the parity generation is 1, and
the error-correcting code resulted from the parity generation is transformed after performing the parity generation, such that the hamming distance between two codes corresponding to two adjacent threshold voltage states in the error-correcting code resulted from the parity generation is 1.

2. The programming method for the memory according to claim 1, wherein the memory includes an array of multilevel cells (MLC).

3. The programming method for the memory according to claim 1, wherein the codes in the data to be performed the parity generation are transformed according to a gray code system.

4. The programming method for the memory according to claim 1, wherein the codes in the error-correcting code resulted from the parity generation are transformed according to a gray code system.

5. A reading method for a memory, comprising:
reading a data and an error-correcting code recorded in the memory;
performing a syndrome generation on the data; and
performing a correction on the data according to an output of the syndrome generation;
wherein the data is transformed before performing the syndrome generation, such that a hamming distance between two codes corresponding to two adjacent threshold voltage states in the data to be performed the syndrome generation is 1, and
the data outputted from the correction is transformed, such that the hamming distance between two codes corresponding to two adjacent threshold voltage states in the data outputted from the correction is 1.

6. The reading method for the memory according to claim 5, wherein the memory includes an array of multilevel cells (MLC).

7. The reading method for the memory according to claim 5, wherein the codes in the data to be performed the syndrome generation are transformed according to a gray code system.

8. The reading method for the memory according to claim 5, wherein the codes in the data outputted from the correction are transformed according to a gray code system.

9. The reading method for the memory according to claim 5, wherein the error-correcting code is transformed before performing the syndrome generation, such that the hamming distance between two codes corresponding to two adjacent threshold voltage states in the error-correcting code to be performed the syndrome generation is 1.

10. The reading method for the memory according to claim 5, wherein the codes in the error-correcting code to be performed the syndrome generation are transformed according to a gray code system.

11. An operating system for programming a memory, comprising:
an inputting unit for providing a data;
a parity generation unit for performing a parity generation to obtain an error-correcting code (ECC); and
a transforming unit for transforming the data before performing the parity generation, such that a hamming distance between two codes corresponding to two adjacent threshold voltage states in the data to be performed the parity generation is 1,
wherein the transforming unit is further for transforming the error-correcting code resulted from the parity generation after performing the parity generation, such that the hamming distance between two codes corresponding to two adjacent threshold voltage states in the error-correcting code resulted from the parity generation is 1.

12. The operating system according to claim 11, wherein the memory includes an array of multilevel cells (MLC).

13. The operating system according to claim 11, wherein the transforming unit transforms the codes in the data to be performed the parity generation according to a gray code system.

14. The operating system according to claim 11, wherein the transforming unit transforms the codes in the error-correcting code resulted from the parity generation according to a gray code system.

15. The operating system according to claim 11, wherein the operating system is further reading the memory, and the operating system further comprises:
a reading unit for reading the data and the error-correcting code recorded in the memory;
a syndrome generation unit for performing a syndrome generation on the data; and
a correction unit for performing a correction on the data according to an output of the syndrome generation;
wherein the transforming unit further transforms the data before performing the syndrome generation, such that the hamming distance between two codes corresponding to two adjacent threshold voltage states in the data to be performed the syndrome generation is 1.

16. The operating system according to claim 15, wherein the transforming unit transforms the codes in the data to be performed the syndrome generation according to a gray code system.

17. The operating system according to claim 15, wherein the transforming unit is further for transforming the data outputted from the correction, such that the hamming distance between two codes corresponding to two adjacent threshold voltage states in the data outputted from the correction is 1.

* * * * *